United States Patent [19]

Kosonocky

[11] Patent Number: 4,667,213
[45] Date of Patent: May 19, 1987

[54] CHARGE-COUPLED DEVICE CHANNEL STRUCTURE

[75] Inventor: Walter F. Kosonocky, Montgomery Township, Somerset County, N.J.

[73] Assignee: RCA Corporation, Princeton, N.J.

[21] Appl. No.: 917,287

[22] Filed: Oct. 9, 1986

Related U.S. Application Data

[63] Continuation of Ser. No. 653,565, Sep. 24, 1984, abandoned.

[51] Int. Cl.[4] .............................................. H01L 29/78
[52] U.S. Cl. ......................................... 357/24; 357/30
[58] Field of Search ..................... 357/24, 24 C, 24 M, 357/30; 377/57, 58, 61-63

[56] References Cited

U.S. PATENT DOCUMENTS 3,896,474  7/1975  Amelio et al. ................... 357/24 M
4,012,759  3/1977  Esser ................................ 357/24
4,028,716  6/1977  Van Santen et al. ............ 357/24 M
4,206,371  6/1980  Weimer ............................ 357/24 X
4,362,575 12/1982  Wallace ......................... 357/24 M X

FOREIGN PATENT DOCUMENTS 57-7964  1/1982  Japan .

OTHER PUBLICATIONS

Mohsen, A. M., and Tompsett, M. F., "The Effects of Bulk Traps on the Performance of Bulk Channel Charge-Coupled Devices", IEEE Transactions on Electron Devices, vol. Ed-21, No. 11, Nov. 1974, pp. 701-711.
Chakravarti, S. N., and Das, P., "Multiple Buried Channel Charge-Coupled Device", Solid State Electronics, vol. 23, No. 7, Jul. 1980, pp. 747-753.
"Design and Performance of 64×128 Element PtSi Schottky-barrier Infrared Charge-Coupled Device (IRCCD) Focal Plane Array", W. F. Kosonocky et al., SPIE, vol. 344, Infrared Sensor Technology, 1982, pp. 66-77.

Primary Examiner—Martin H. Edlow
Assistant Examiner—Sara W. Crane
Attorney, Agent, or Firm—Joseph S. Tripoli; Donald S. Cohen

[57] ABSTRACT

A buried-channel charge-coupled device includes a substrate of semiconductor material of one conductivity type having therein and along a surface thereof a major channel region of the opposite conductivity type and at least one supplemental channel region of the opposite conductivity type. Conductive gates extend across the channel regions and are positioned therealong. The supplemental channel region is of a volume smaller than that of the major channel region and is completely within the major channel region. Also, the supplemental channel region is of a higher conductivity than the major channel region. The supplemental channel region serves to confine small electrical charges so that the small charges can be transferred along the charge-coupled device with good efficiency, particularly when the device is being operated at low temperatures, such as when it is part of an infrared image sensor.

12 Claims, 8 Drawing Figures

CHARGE-COUPLED DEVICE CHANNEL STRUCTURE

This is a continuation of application Ser. No. 653,565, filed Sept. 24, 1984 and now abandoned.

The present invention relates to a buried-channel charge-coupled device (CCD) channel structure having improved charge transfer efficiency at low temperatures and, more particularly to a CCD channel structure which is useful in an infra-red CCD (IR-CCD) imager sensor.

BACKGROUND OF THE INVENTION

A buried-channel charge-coupled device (CCD) is a solid state transfer device for transferring a charge. Such devices in general include a body of semiconductor material, such as single crystalline silicon, having a channel therein in the form of a region of a conductivity type opposite to that of the semiconductor body, extending along a surface of the body. A plurality of conductive gates extend across and are insulated from the channel and are positioned along the channel. By applying appropriate potentials to the gates in sequence, a charge in the channel can be transferred along the channel. One use for such a CCD transfer device is in an image sensor having a plurality of radiation detectors arranged in columns, and a separate transfer CCD register along each column of detectors with each of the detectors being connected to the CCD. Charges which are generated in the detectors by the radiation received by the detectors are transferred to the connected CCD and then are transferred along the CCD to an output CCD register which extends across the ends of and is connected to the transfer CCD registers and transfers the charges to an output circuit. One such image sensor which uses Schottky-barrier detectors for detecting infra-red radiation is described in the article of W. F. Kosonocky et al., entitled "Design and Performance of 64×128 Element PtSi Schottky-barrier Infrared Charge-Coupled Device (IRCCD) Focal Plane Array", published in SPIE, Volume 344, *Infrared Sensor Technology* (1982), pp. 66–77.

One problem which arises in the use of CCD transfer devices relates to the charge transfer inefficiency of the devices. The charge transfer inefficiency is related to charge transfer losses, which, in a buried-channel CCD, is proportional to the volume of the buried channel. The charge transfer inefficiency of the CCD is of particular concern in an infra-red CCD image sensor which requires low operating temperatures, in the range of 77° to 130° K., since there is a further reduction of charge transfer efficiency at low operating temperatures. This is of particular concern when the image sensor is operating at low single levels which provide signal charges which do not fill the channel of the CCD.

SUMMARY OF THE INVENTION

A buried-channel charge-coupled device includes a substrate of semiconductor material of one conductivity type having at least one major surface. Within the substrate and along the major surface is a first means for confining an electrical charge. Also within the substrate and along the major surface is a second means for confining a charge smaller than that which can be confined in the first means and allowing any excess charges to overflow into the first means. A plurality of conductive gates are over the major surface of the substrate and are positioned along the confining means.

DETAILED DESCRIPTION OF THE PREFERRED EMBODIMENT

Figure 1:
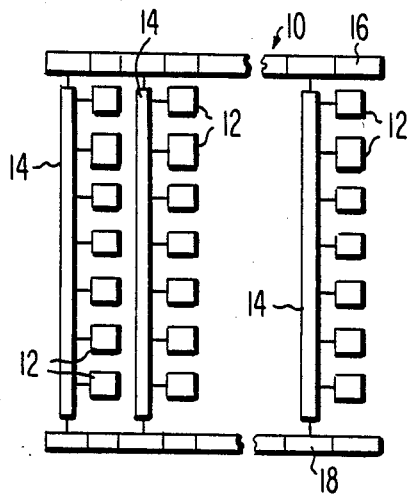
FIG. 1 is a schematic view of the construction of a typical IR-CCD image sensor.

Referring initially to FIG. 1, there is shown a schematic block diagram of a typical IR-CCD sensor array, which is generally designated at 10. The sensor array 10 includes a plurality of IR detectors 12 arranged in parallel vertical columns. Extending along each column of detectors 12 is a vertical column CCD register 14 to which the detectors 12 of the adjacent vertical array are connected. An input CCD register 16 extends along one end of the vertical column CCD registers 14 and is connected to each of the vertical column CCD registers 14. An output CCD register 18 extends along the other ends of the vertical column CCD registers 14 and is connected thereto.

Figure 2:
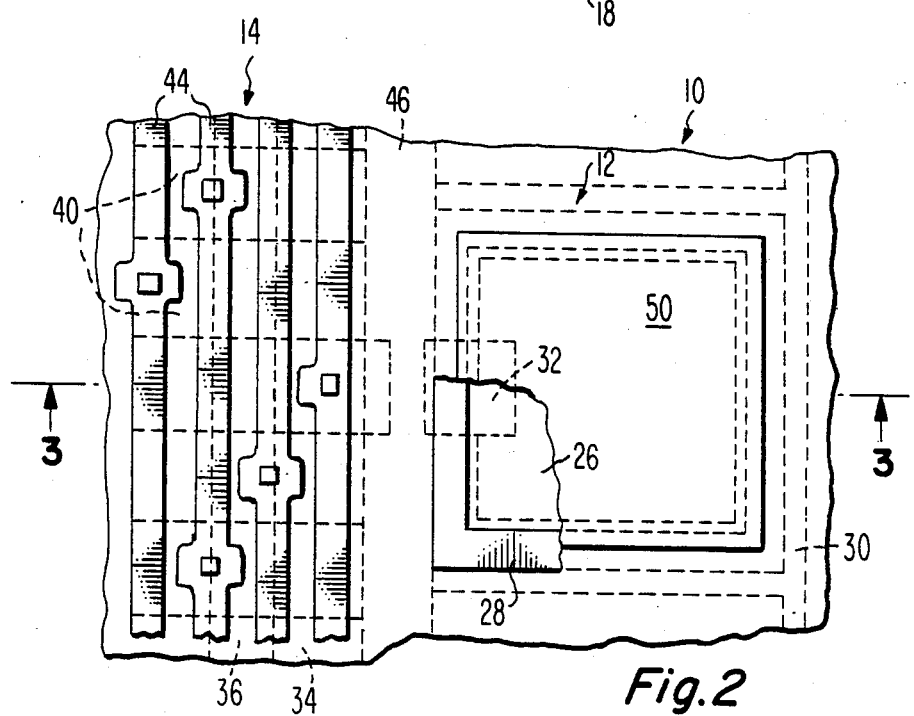
FIG. 2 is a top plan view of one pixel of one type of an IR-CCD image sensor which includes the present invention.
Figure 3:
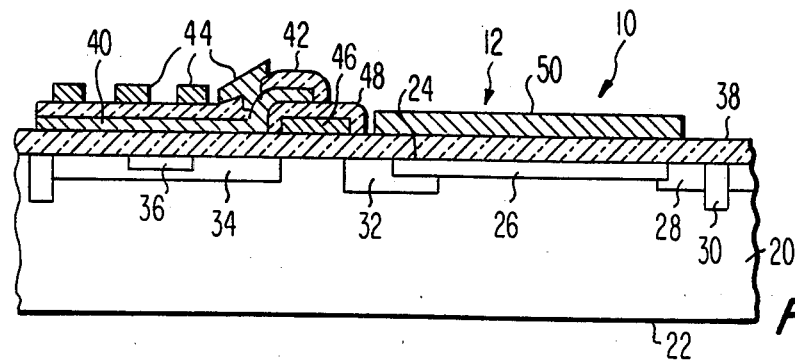
FIG. 3 is a sectional view along line 3—3 of FIG. 2.

Referring to FIGS. 2 and 3, there is shown the details of construction of one pixel of one form of an IR-CCD image sensor which incorporates the present invention. The pixel includes one detector 12 and a portion of its related vertical column CCD register 14. The sensor array 10 is formed in and on a substrate 20 of single crystalline silicon of P type conductivity which has a pair of opposed major surfaces 22 and 24. The detector 12 is a thin layer 26 of a conductive material, such as a silicide of platinum or palladium, formed in the substrate 20 along the surface 24. The conductive layer 26 forms a Schottky-barrier junction with the substrate 20. Extending around the edge of the conductive layer 26 is a guard-ring 28 in the form of a region of N type conductivity extending into the substrate 20 from the surface 24. Around the guard-ring 28 is a channel stop 30 in the form of a region of P type conductivity extending into the substrate 20 from the surface 24. At the edge of the conducting layer 26 adjacent to the vertical CCD register 14 is a conductive region 32 of N+ type conductivity extending into the substrate 20 from the surface 24 and partially overlapping and forming a contact with the conductive layer 26.

The vertical CCD register 14 includes a major buried channel 34 in the form of an N type region within the substrate 20 extending along the surface 24 parallel to the column of the detectors 12. Within the major buried channel 34 is a supplemental buried channel 36 in the form of a higher doped N type region within the substrate 20 and extending along the surface 24. The supplemental buried channel 36 contains a higher concentration of the conductivity modifiers than the major channel 34 so as to be of a higher conductivity, and is of a volume smaller than that of the major buried channel 34, so as to be contained entirely within the major buried channel 34. A thin layer 38 of silicon oxide extends across the entire surface 24 of the substrate 20. A plurality of side-by-side gates 40 are on the silicon oxide layer 38 and extend transversely across the channels 34 and 36. The gates 40 are layers of a conductive material, such as conductive polycrystalline silicon. A layer 42 of silicon oxide extends over the gates 40. Four metal buss lines 44, generally of aluminum, are on the silicon oxide layer 42 and extend in spaced parallel relation across the gates 40. Each of the buss lines 44 extends through openings in the silicon oxide layer 42 to contact separate ones of the gates 40. Each of the buss lines 44 is connected to every fourth gate 40.

A transfer gate 46 is on the silicon oxide layer 38 and extends between the detectors 12 and the vertical CCD register 14. The transfer gate 46 is a layer of a conductive material, such as doped polycrystalline silicon. The transfer gate 46 overlaps a portion of each of the conductive regions 32 and an edge of the major channel region 34. A layer 48 of silicon oxide extends over the transfer gate 46. One of the gates 40 of the vertical CCD register 14 is in alignment with the conductive region 32 of the detector 12. This allows for transfer of the charge from the detector 12 to the vertical CCD register 14. A thin layer 50 of a metal, such as aluminum, is on the silicon oxide layer 38 over each of the conductive layers 26 of the detectors 12. The metal layer 50 serves as a mirror to reflect any radiation which may pass through the conductive layer 26 back into the conducting layer 26.

In the operation of the sensor array 10, radiation passing through the substrate 20 from the surface 22 is converted to an electrical charge by the detectors 12. When an appropriate potential is applied to the transfer gate 46, the charge in the conductive layer 26 of the detector 12 is transferred to the channels 34 and 36 of the vertical register CCD 14. By applying an appropriate potential to the gates 40 in sequence, the charge in the channels 34 and 36 can be transferred along the vertical CCD register 14 to the output CCD register.

Figure 4:
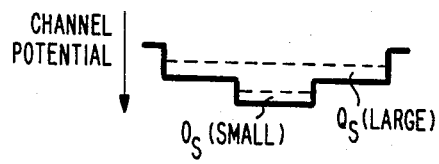
FIG. 4 is a graph showing the potential profile of the channel of the CCD register shown in FIG. 3.

The potential applied to the gates 40 creates a potential well in the channels 34 and 36. Since the supplemental channel 36 has a higher doping level than the major channel 34, the potential well in the supplemental channel 36 is deeper than that created in the major channel 34 as shown in FIG. 4. Thus, when the charge is transferred from the detector 12 into the channels 34 and 36, the charge will flow first into the deeper well created in the supplemental channel 36. If the charge is large enough it will overflow the deeper well into the shallower well created by the channel 34. However, a small charge will be confined solely to the volume of the supplemental channel 36.

As previously stated, the transfer inefficiency is proportional to the volume of the buried channel. By having the smaller charge retained in the smaller volume supplemental channel 36, the transfer efficiency of the charge along the supplemental channel 36 will be higher than if the small charge was in the larger volume major channel 34. Thus, a small charge will be transferred along the CCD register 14 at a higher efficiency. However, a larger charge will overflow into the well of the major channel 34 so that it can be properly transferred along the channel 34 with relatively high efficiency. Thus, the CCD register of the present invention will transfer both a small charge and a large charge at relatively good efficiencies.

Figure 5:
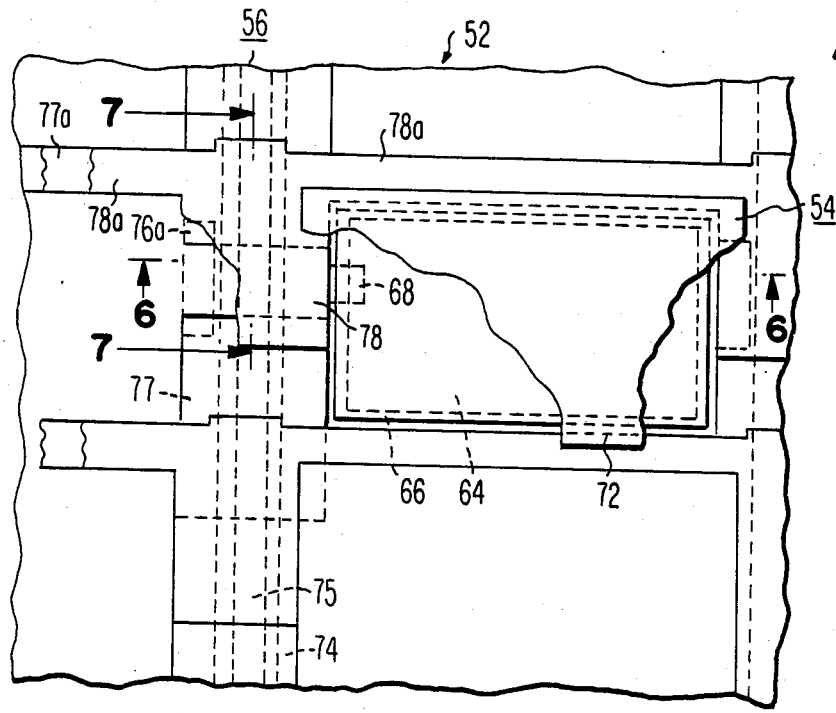
FIG. 5 is a top plan view of one pixel of another form of IR-CCD image sensor which incorporates the present invention.
Figure 6:
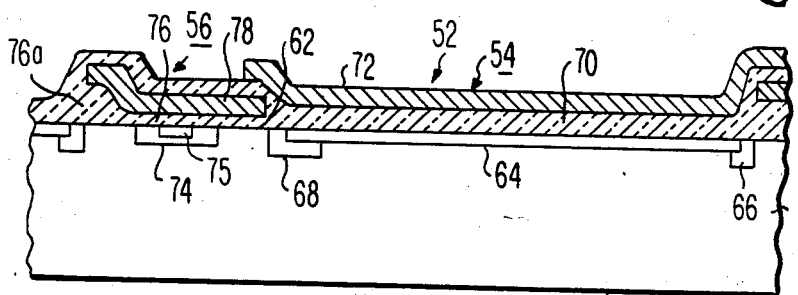
FIG. 6 is a sectional view taken along line 6—6 of FIG. 5.
Figure 7:
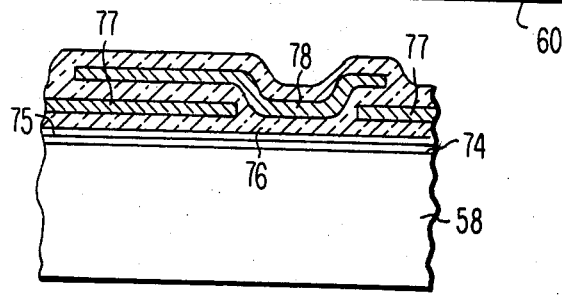
FIG. 7 is a sectional view taken along line 7—7 of FIG. 5.

Referring to FIGS. 5–7, another form of an IR-CCD image sensor which incorporates the present invention is generally designated as 52. Image sensor 52 includes an array of detectors 54 arranged in columns and vertical CCD registers 56 between the columns of the detectors 54. The image sensor 52, like the image sensor 10 is formed in a substrate 58 of P type conductivity single crystalline silicon having opposed major surfaces 60 and 62.

Each of the detectors 54 includes an area 64 of a conductive material in the substrate 58 along the surface 62, which forms a Schottky-barrier junction with the substrate 58. The detector area 64 is preferably of either platinum silicide or palladium silicide. Around the edge of the detector area 64 is a guard-ring 66 in the form of a region of N type conductivity within the substrate 58 at the surface 62. Along the edge of the detector area 64 adjacent the vertical CCD register 56 is a conductive region 68 of N+ type conductivity in the substrate 58 at the surface 62. The conductive region 68 serves to provide electrical coupling of the charge from the detector 54 to the channel of the vertical CCD register 56. However, if desired, by making the entire guard-ring 66 of Ni+ type conductivity the guard-ring 66 will also serve as the conductive region. A layer 70 of deposited silicon oxide is on the surface 62 of the substrate 58 and extends over the detector area 64. A metal layer 72 is on the silicon oxide layer 70 over each of the detector areas 64. The metal area 72 is of a metal, such as aluminum, which will reflect radiant energy, to serve as a mirror to reflect back into the detector area 64 any radiant energy which may pass therethrough.

The vertical CCD register 56 includes a major channel 74 in the form of a region of N type conductivity within the substrate 58 and extending along the surface 62 between the columns of detectors 54. The major channel 74 is spaced from the adjacent edges of the detector area 64 of the detectors 54. Within the major channel 74 is a supplemental channel 75 of a region of N type conductivity but having a higher concentration of conductivity modifiers than the major channel 74. The supplemental channel 75 is of a volume less than that of the major channel 74 and is completely within the major channel 74. A thermally grown layer 76 of silicon oxide extends over the channel 74 and 75. Two sets of gates 77 and 78 are on the silicon oxide layer 76 and extend across the channels 74 and 75. The gates 77 and 78 are of a conductive material, such as doped polycrystalline silicon. The first set of gates 77 are all directly on the silicon oxide layer 76 and each of the gates 77 extends along a portion of two adjacent detectors 54 crossing the space between the two adjacent detectors 54. The adjacent ends of adjacent gates 77 are spaced apart in the portion of the channels 74 and 75 adjacent the conductive region 68 of the adjacent detector 54. Each of the first set of gates 77 has an extension 77a which extends over the substrate surface 62 between adjacent detectors 54 and is spaced from the substrate surface 62 by a portion of the silicon oxide layer 76. The gate extensions 77a electrically connect similar first gates 77 in all of the vertical CCD registers 14 and one of the extensions 77a extends to a terminal contact at one edge of the sensor array 10.

As shown in FIG. 7, each of the second gates 78 is on the oxide layer 76 between the spaced edges of two adjacent first gates 77. The second gate 78 extends slightly over one of the adjacent first gates 77 and extends over the other adjacent first gates 77 to the space between two adjacent detectors 54. The second gate 78 is spaced from the first gate 77 by a layer 80 of silicon oxide. As shown in FIG. 6, each of the second gates 78 extends up to the edge of the detectors 54 at each side of the vertical CCD register 56. Thus, the second gate 78 projects beyond each side of the major channel 74 and over the portions of the substrate surface 62 between the major channel 74 and each of the adjacent detectors 54.

In the area of the substrate surface 62 which is between the major channel 74 and the detector 54 which is not connected to the particular vertical CCD register 56, the silicon oxide layer 76 has a portion 76a which is thicker than the rest of the silicon oxide layer 76. A portion of each of the second gates 78 extends over the thicker portion 76a of silicon oxide so that it is spaced from the substrate surface 62 a distance greater than the spacing between the rest of the gate 78 and the substrate surface 62. Each of the second gate 78 has an extension 78a which extends over an extension 77a of a first gate 77 and is spaced therefrom by a silicon oxide layer. The extensions 78a electrically connect corresponding second gates 78 of the various vertical CCD registers 56 with one of the extensions 78a extending to terminals at one edge of the image sensor array 52.

In the operation of the image sensor 52, charges collected in the detectors 54 are transferred to the vertical CCD register 56 when a positive potential is applied to the second gates 78. The gates 77 and 78 are then clocked with negative potentials to cause the charges to move along the channels 74 and 75 to the output register at the end of the vertical registers 56. The potentials applied to the gates 77 and 78 cause potential wells in the channels 74 and 75 with the well in the supplemental channel 75 being deeper than that in the major channel 74. Thus, charges entering the channel 74 and 75 from the detectors 54 will first fill up the deeper well in the supplemental channel 75 and, if the potential is large enough, will overflow into the well in the major channel 74. However, if the charge from the detector 54 is small, it will remain in the supplemental well 75 so that it can be transferred along the vertical CCD register 56 with relatively good efficiency.

Figure 8:
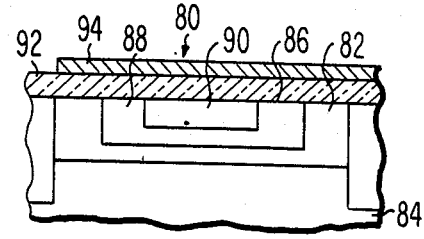
FIG. 8 is a sectional view of still another form of CCD register which includes the present invention.

Although the CCD registers 14 and 56 have been described as having one supplemental channel 36 and 75 in the major channel 34 and 74 respectively, there can be more than one supplemental channel in the major channel. Referring to FIG. 8 there is shown a CCD register 80 having a major channel 82 in the substrate 84 and extending along the surface 86 of the substrate 84. A first supplemental channel 88 is in the substrate 84 and along the surface 86 and is confined within the major channel 82. A second supplemental channel 90 is within the substrate 84 and along the surface 86 and is confined within the first supplemental channel 88. Thus, the first supplemental channel 88 is smaller in volume than the major channel 82 and the second supplemental channel 90 is of a volume less than the first supplemental channel 88. The first supplemental channel 88 has a higher concentration of conductivity modifiers than contained in the major channel 82 so as to be of a higher conductivity than the major channel 82. The second supplemental channel 90 contains a higher concentration of conductivity modifiers than the first supplemental channel 88 so as to be of a higher conductivity than the first supplemental channel 88. A layer 92 of silicon oxide is on the substrate surface 86 and extends over the channels 82, 88 and 90. A plurality of gates 94, only one of which is shown, of a conductive material, such as conductive polycrystalline silicon, are on the silicon oxide layer 92. The gates 94 extend across the channels 82, 88 and 90 and are positioned along the channels.

When a potential is applied to the gates 94, potential wells are generated in the channels 82, 88 and 90. The potential well generated in the first supplemental channel 88 will be deeper than that in the major channel 82, and the potential well generated in the second supplemental well 90 will be deeper than that in the first supplemental well 88. Thus, a charge entering the channels will first flow into the deepest potential well in the second supplemental channel 90. As the charge increases it will overflow into the potential well in the first supplemental channel 88 and then will overflow into the potential well in the major channel 82. Thus, a small charge will be confined to the second supplemental channel 90, a charge of intermediate size will be confined to the first supplemental well 86 and a large charge will be in the major channel 82. Thus, the CCD register 80 can transfer with good efficiency large charges and charges of intermediate and small size.

In a CCD image sensor 10 of the type shown in FIG. 1, the supplemental channels can be provided in the vertical CCD registers 14 as well as the output CCD register 18. However, if desired, the supplemental channels can be provided in only the output CCD register 18.

To demonstrate the improvement achieved by the present invention the following devices were made:

EXAMPLE I

An infra-red charge-coupled device image sensor was made in a substrate of P-type single crystalline silicon having 32×63 array of detectors with the conductive layer of the detectors being of palladium silicide. The output CCD register had a major channel region 110 micrometers wide of N type conductivity (phosphorus implant with a dose of $1.3 \times 10^{12}$ cm$^{-2}$) and a supplemental channel region 20 micrometers wide of N type conductivity (arsenic implanted at 150 KeV and a dose of $5 \times 10^{11}$ cm$^{-2}$. For very low signal level the transfer losses at 77k were reduced to about $2 \times 10^{-4}$ per transfer from a value for a CCD without the supplemental channel region of from $10^{-3}$ to $10^{-2}$ per transfer.

EXAMPLE II

An infra-red charge-coupled device image sensor was made in a substrate of P-type single crystalline silicon having a 64×128 array of detectors. The output CCD register had a major channel region 15 micrometers wide and of N type conductivity (phosphorus implant at a dose of $1.3 \times 10^{12}$ cm$^{-2}$) and a supplemental channel region 5 micrometers wide of N type conductivity (arsenic implant at a dose of $5 \times 10^{11}$ cm$^{-2}$). The following table shows the transfer loss per transfer ($\epsilon$) for this register as compared to that for a similar register which included only the major channel region.

| Device | Temp. (K) | V signal (mV) | Bias Charges (mV) | $\epsilon$/Transfer |
| --- | --- | --- | --- | --- |
| Major Channel Only | 300 | 20 | 0 | $2 \times 10^{-4}$ |
|  | 300 | 400 | 0 | $9.8 \times 10^{-5}$ |

-continued

| Device | Temp. (K) | V signal (mV) | Bias Charges (mV) | $\epsilon$/Transfer |
|---|---|---|---|---|
| | 300 | 20 | 200 | $2 \times 10^{-4}$ |
| | 300 | 400 | 200 | $9.8 \times 10^{-5}$ |
| | 77 | 20 | 0 | $2.9 \times 10^{-3}$ |
| | 77 | 400 | 0 | $6.3 \times 10^{-4}$ |
| | 77 | 20 | 200 | $2 \times 10^{-4}$ |
| | 77 | 400 | 200 | $9.8 \times 10^{-5}$ |
| Major Channel and Supplemental Channel | 300 | 20 | 0 | $2 \times 10^{-4}$ |
| | 300 | 400 | 0 | $9.8 \times 10^{-5}$ |
| | 300 | 20 | 200 | $2 \times 10^{-4}$ |
| | 300 | 400 | 200 | $6.8 \times 10^{-5}$ |
| | 77 | 20 | 0 | $2 \times 10^{-4}$ |
| | 77 | 400 | 0 | $4.4 \times 10^{-4}$ |
| | 77 | 20 | 200 | $2 \times 10^{-4}$ |
| | 77 | 400 | 200 | $2.9 \times 10^{-4}$ |

Although the present invention has been shown and described as being used in an IR-CCD imager sensor having an array of the detectors arranged in a plurality of columns with each column having a separate vertical buried-channel CCD register, the invention can be used in other types of CCD imagers. For example, it can be used in a line sensor imager which includes only a single line of the detectors and a single CCD register. Such a line sensor imager includes a transfer gate between the detectors and the CCD register of a construction such as shown in FIGS. 2 and 3. However, the CCD register does not include the metal buss lines shown in FIGS. 2 and 3 but the gates of the CCD are terminated along one edge of the CCD register.

Also, the present invention can be used in the buried-channel of a visible CCD image sensor, particularly one of large size. Such image sensors generally include a photosensing array, known as the A-register, a temporary storage array, known as the B-register, and an output register, known as the C-register. The A-register can include a plurality of spaced, parallel buried-channel regions and a plurality of conductive, parallel gates extending transversely across and insulated from the channels. The B-register would include a plurality of spaced, parallel buried-channels which are extensions of the A-channel channels and a plurality of conductive, parallel gates extending across the B-register channels. The C-register would include a single buried-channel extending across the end of the B-register channels, and a plurality of conductive gates extending transversely across the C-register channel. Light from the image being detected enter the portion of the subtrate in which the A-register of the imager is formed and the photons are converted to electrons in the channels of the A-register. The electrons are transferred along the A-register channels to the B-register channels and then to the channel of the C-register. The supplementary channel of the present invention can be included in the C-register channel or in all of the channels.

Thus, there is provided by the present invention a CCD transfer device having a buried channel in which is generated potential wells of different size so that charges entering the channel will be confined to a volume of the channel which is close in size to that of the charge. This permits the charge to be transferred along the channel with greater efficiency.

I claim:

1. A buried-channel charge-coupled device comprising
a substrate of semiconductor material of one conductivity type having at least one major surface,
first channel means of a defined width in said substrate and extending along said major surface said first channel means being of a conductivity type opposite to that of the substrate and having a doping concentration such that the first channel means can form a potential well of a depth for confining an electrical charge along the entire length of the first channel means,
second channel means of a conductivity type opposite to that of the substrate in said substrate at said one surface and within said first channel means and having a width less than that of said first channel means, said second channel means extending along said major surface and having a doping concentration greater than the adjacent portions of the first channel means such that it can form a potential well deeper than that formed by the first channel means for confining a maximum electrical charge of a size smaller than can be confined by said first channel means and allowing any excess charge to overflow into said first channel means, and
a plurality of conductive gates over and insulated from said major surface of said substrate and positioned along said first and second channel means.

2. A buried-channel charge-coupled device in accordance with claim 1 including barrier means along the sides of the first channel means.

3. A buried-channel charge-coupled device in accordance with claim 1 in which said supplemental channel region is of a volume smaller than the volume of said major channel region.

4. A buried-channel charge-coupled device in accordance with claim 3 in which said supplemental channel region is completely within the major channel region.

5. A buried-channel charge-coupled device in accordance with claim 4 including a second supplemental channel region of a conductivity type opposite to that of the substrate within the substrate and along said major surface, said second supplemental channel being within, of a volume smaller than and of a conductivity higher than the first supplemental channel.

6. In a buried-channel charge-coupled device image sensor which includes, in a substrate of semiconductor material of one conductivity type, a plurality of radiation detectors arranged in parallel columns, a separate vertical charge-coupled device register extending along each of said detector columns and connected to said detectors, and an output charge-coupled device register extending across the ends of and connected to said vertical registers, each of said registers including a major channel region of a conductivity type opposite to that of the substrate and of a defined width, the doping concentration in said major channel being such that it can form a potential well of a depth to receive and confine electrical charges from the detectors, barrier means along each side of said major channel region and conductive gates extending over and positioned along said channels, the improvement comprising,
at least one of said registers having channel means of a conductivity type opposite to that of the substrate within its major channel region of a width less than that of its major channel region, said channel means having a doping concentration greater than the major channel region such that it can form a potential well deeper than that formed by the major channel region for confining a maximum electrical charge which is smaller than the maximum charge which can be confined by the major channel.

7. The image sensor in accordance with claim 6 in which said supplemental channel region is of a volume smaller than that of the major channel region and is completely with the major channel region.

8. The image sensor in accordance with claim 7 in which the output charge-coupled device register includes a supplemental channel region.

9. The image sensor in accordance with claim 7 in which all of the charge-coupled device registers includes a supplemental channel region.

10. The image sensor in accordance with claim 7 including a second supplemental channel region of a conductivity type opposite to that of the substrate within the substrate, said second supplemental channel region being of a volume smaller than, being completely within and being of a higher conductivity than the first supplemental channel region.

11. A buried-channel charge-coupled device image sensor comprising
 a substrate of semiconductor material of one conductivity type,
 a plurality of radiation detectors arranged in a row along one surface of said substrate, and
 a charge-coupled device register extending along said row of radiation detectors, said register including a major channel region of a defined width and of a conductivity type opposite to that of the substrate within said substrate and extending along said one surface, said major channel having a doping concentration such that it can form a potential well of a depth for confining an electrical charge along the entire length of the major channel, channel means of a conductivity type opposite to that of the substrate within said major channel and of a width less that that of said major channel, said channel means having a doping concentration greater than that of the major channel so that the channel means can form a potential well deeper than that of the major channel for confining a maximum electrical charge which is smaller than the maximum charge which can be confined by the major channel, barrier means between the major channel and the row of detectors means for transferring charges from the detectors to said channel and gates extending transversely across said channel and electrically insulated from said one surface.

12. An image sensor in accordance with claim 11 in which the supplemental channel region is of a volume smaller than that of the major channel region and is completely within the major channel region.

* * * * *